US007349207B2

(12) United States Patent
Harris et al.

(10) Patent No.: US 7,349,207 B2
(45) Date of Patent: Mar. 25, 2008

(54) HEAT DISSIPATING AUDIO SYSTEMS AND METHODS THEREOF

(75) Inventors: Kenneth David Harris, Hollis, NH (US); Vian W. Y. Li, Kowloon Tong (HK)

(73) Assignee: Brookstone Purchasing, Inc., Merrimack, NH (US)

( * ) Notice: Subject to any disclaimer, the term of this patent is extended or adjusted under 35 U.S.C. 154(b) by 149 days.

(21) Appl. No.: 11/222,013

(22) Filed: Sep. 8, 2005

(65) Prior Publication Data

US 2006/0039571 A1 Feb. 23, 2006

(51) Int. Cl.
*H05K 7/20* (2006.01)
*H05K 5/00* (2006.01)
*H04R 25/00* (2006.01)

(52) U.S. Cl. ...................... 361/690; 361/704; 361/707; 361/710; 361/715; 181/148; 381/87; 381/397

(58) Field of Classification Search ................ 361/697; 381/87, 189, 397, 81
See application file for complete search history.

(56) References Cited

U.S. PATENT DOCUMENTS 4,811,403 A * 3/1989 Henricksen et al. .......... 381/87
5,533,132 A * 7/1996 Button ........................ 381/332
6,390,231 B1 * 5/2002 Howze ........................ 181/148
6,837,333 B2 * 1/2005 Howze ........................ 181/148
7,181,039 B2 * 2/2007 Stiles et al. ................. 381/397

FOREIGN PATENT DOCUMENTS

JP 03211796 * 9/1991

* cited by examiner

*Primary Examiner*—Gregory D Thompson
(74) *Attorney, Agent, or Firm*—Tim L. Brackett, Jr.; Nixon Peabody LLP

(57) ABSTRACT

An audio system includes a housing which has at least one port, at least one speaker driver with a diaphragm located in the housing, a tube made of one or more thermally conductive materials and having at least two openings, and at least one electronic component which is thermally coupled to the tube. The tube is at least partially located in the housing with one of the openings of the tube at least adjacent to the port of the housing. Movement of the diaphragm helps move air into and out of the tube to dissipate heat.

29 Claims, 4 Drawing Sheets

HEAT DISSIPATING AUDIO SYSTEMS AND METHODS THEREOF

FIELD OF THE INVENTION

This invention generally relates to audio systems and, more particularly, to heat dissipating audio systems and methods thereof.

BACKGROUND

Audio systems contain a variety of different electronic components that generate heat during operation; whereby, audio systems include loudspeakers, audio speakers, stereos, ported speakers, ported loudspeakers, amplified speaker systems, amplifiers, and other single or multi-component units that include an audio speaker and/or an amplifier. As this generated heat builds up, the performance characteristics of these electronic components begin to deteriorate. As a result, over time the output sound quality of the audio system is adversely affected. More specifically, this heat accumulation can lead to complete failure of components or even the whole audio system, sound distortion, and frequency pass cut-off.

To address this problem, these audio systems, with heat generating electrical components, have external heat sinks to try and dissipate the generated heat. The audio systems also sometimes incorporate fan systems within the housing for the audio system to blow air over the heat sinks to vent heat to further aid the cooling process. Unfortunately, these heat sinks, and fan systems can add substantially to the size of the housings and the overall cost, complexity, and signal noise of the audio systems.

SUMMARY

An audio system in accordance with embodiments of the present invention includes a housing which has at least one port, at least one speaker driver with a diaphragm located in the housing, a tube made of one or more thermally conductive materials and having at least two openings, and at least one electronic component which is thermally coupled to the tube. The tube is at least partially located in the housing with one of the openings of the tube at least adjacent to the port of the housing. Movement of the diaphragm helps move air into and out of the tube to dissipate heat.

A method of making an audio system in accordance with other embodiments of the present invention includes providing a housing which has at least one port and locating at least one speaker driver with a diaphragm in the housing. A tube made of one or more thermally conductive materials is positioned at least partially in the housing. The tube has at least two openings with one of the openings of the tube at least adjacent to the port of the housing. At least one electronic component is thermally coupled to the tube.

A method of dissipating heat in an audio system in accordance with embodiments of the present invention includes thermally coupling one or more electronic components to a tube and moving a diaphragm of a speaker driver in the housing. The tube is made of one or more thermally conductive materials, is located at least partially in a housing, and has at least two openings with one opening at least adjacent to an outlet from the housing and another opening of the tube is in the housing. Movement of the diaphragm aids in moving air into and out of the tube through the openings The present invention provides a number of advantages including providing an audio system, such as an acoustic loudspeaker system with onboard electronic components or an audio sound system, which is able to effectively dispose of excess heat generated by internal electronic components.

With the present invention, heat dissipation in the audio system can be accomplished without external heat sinks or "chimney effect" ventilation systems. As a result, the audio system can be constructed to have a sleek and aesthetically pleasing outer appearance. Additionally, since the present invention does not require any type of traditional "chimney effect" venting system to dissipate heat, the present invention also eliminates the risks associated with those types of venting systems. Further, the present invention is more cost effective because it does not require these extra components, such as heat sinks and "chimney effect" ventilation systems, for providing heat dissipation. Without these traditional heat dissipation systems, the present invention is able to accomplish this heat dissipation in substantially less space, while still providing outstanding and "big" sound quality and clarity typically only found in larger systems.

The present invention dissipates heat more thoroughly through the system so there are no excessively hot components to accidentally touch and get burned by, such as with traditional external heat sinks. Overall, the present invention provides an audio system that is relatively cool to the touch and which outputs lukewarm air.

The present invention also extends the life of the audio system by more effectively dissipating the heat generated by internal components. With the present invention, the components of the audio system can be driven hard without fear of heat related damage.

DETAILED DESCRIPTION

Figure 1:
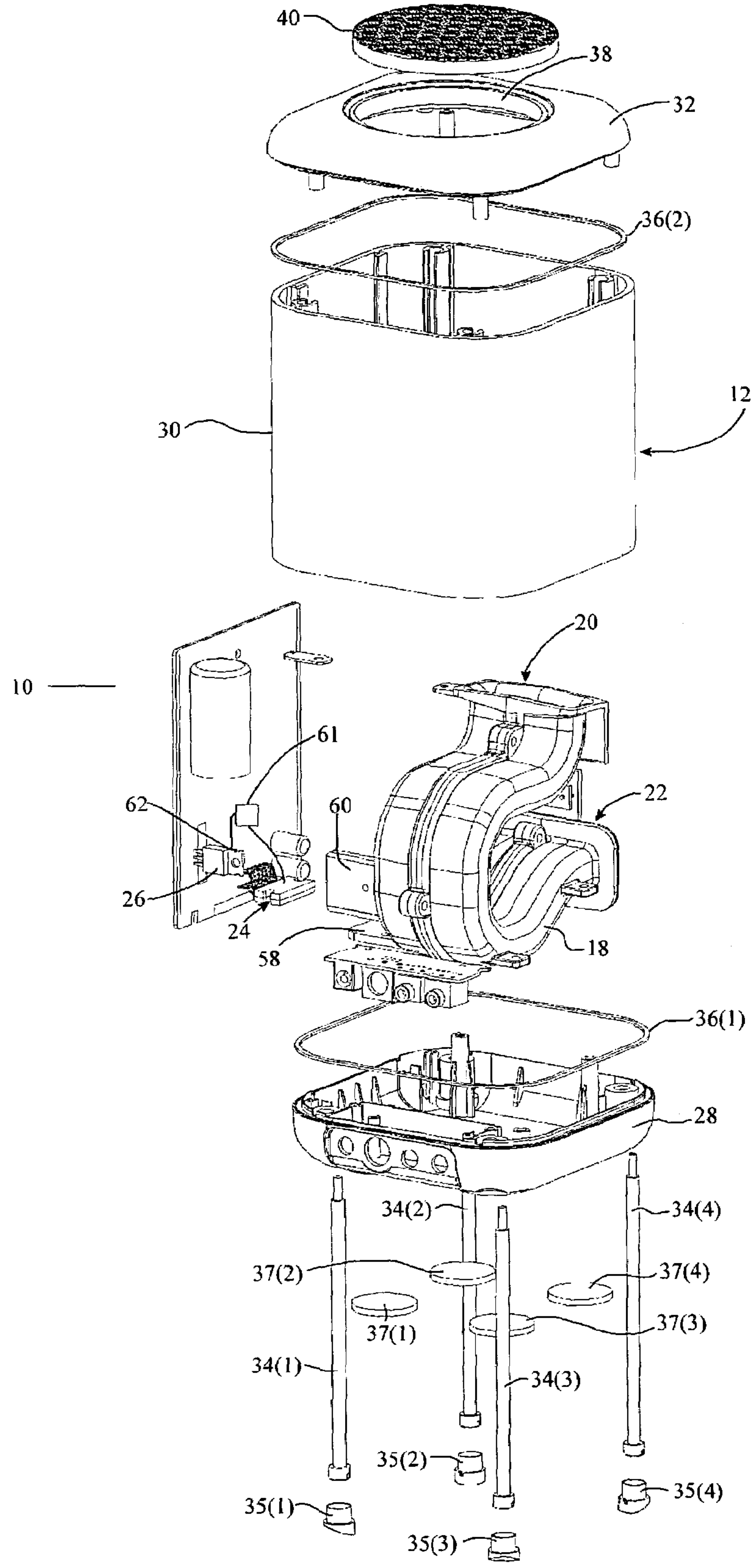
FIG. 1 is an exploded view of an audio system in accordance other embodiments of the present invention.
Figure 2:
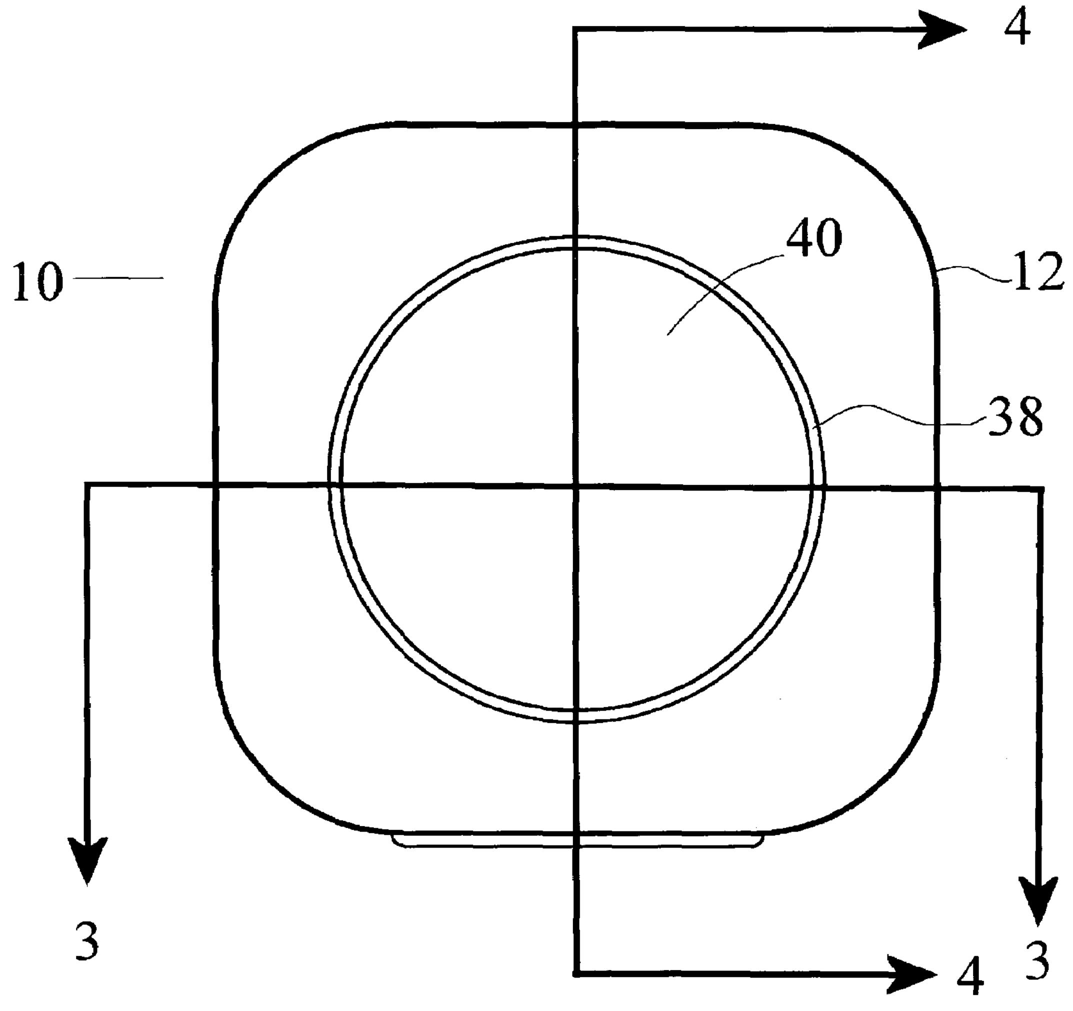
FIG. 2 is a top view of the audio system shown in FIG. 1.

An audio system 10 in accordance with embodiments of the present invention is illustrated in FIGS. 1-4. The system 10 includes a housing 12 with a port 14, a speaker driver 16, a tube 18 with a pair of openings 20 and 22, power amplifier 24, and transistor 26, although the system 10 can comprise other numbers and types of electronic components and elements in other configurations. In this particular embodiment, the audio system 10 is illustrated as an acoustic loudspeaker system with on board amplification, electronics and a power supply, although audio system 10 can comprise numerous other types of systems and devices which require heat dissipation. The present invention provides a number of advantages including providing an audio system 10 which is able to effectively dispose of excess heat generated by internal electronic components without resorting to traditional external heat sink components and/or "chimney effect" ventilation systems; such as extruded heat sinks which rely on heat rising, commonly referred to the "chimney effect".

Figure 3:
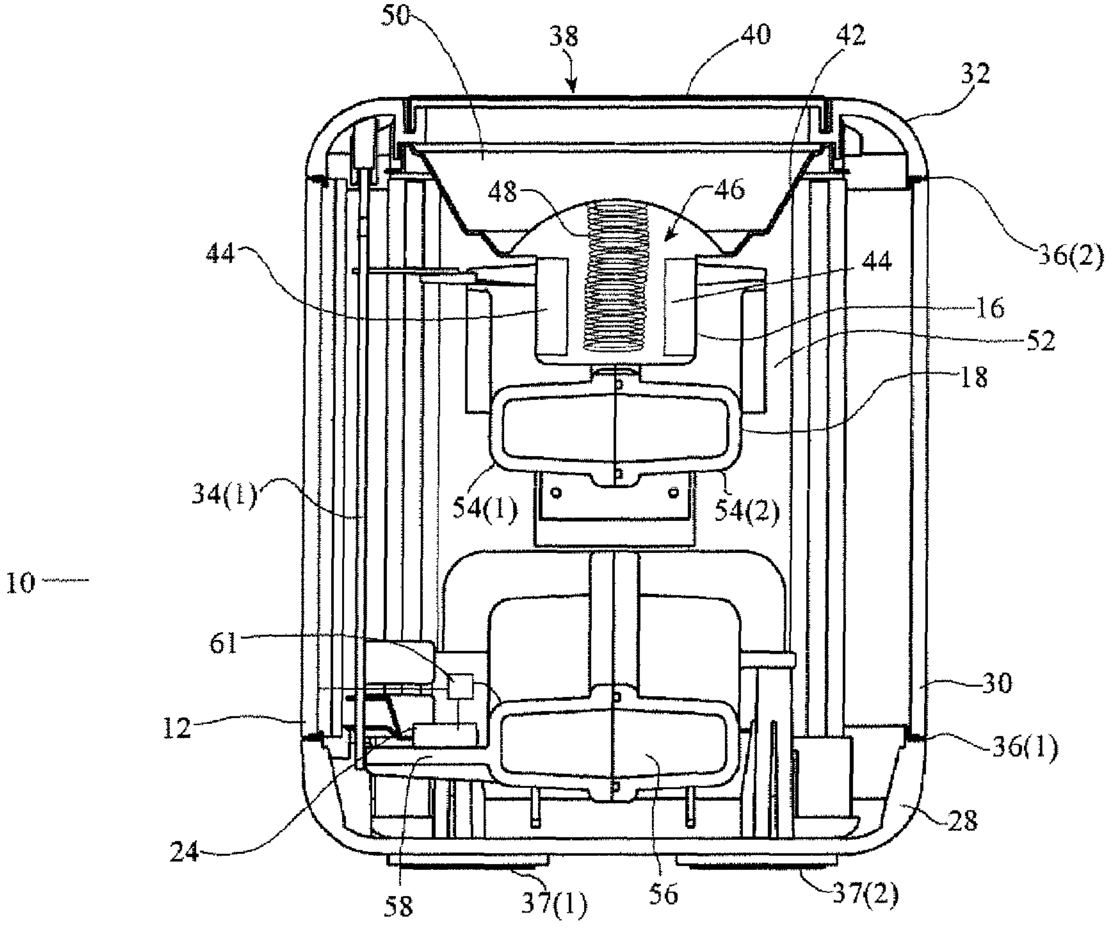
FIG. 3 is a cross-sectional view of the audio system shown in FIG. 2 taken along lines 3-3.
Figure 4:
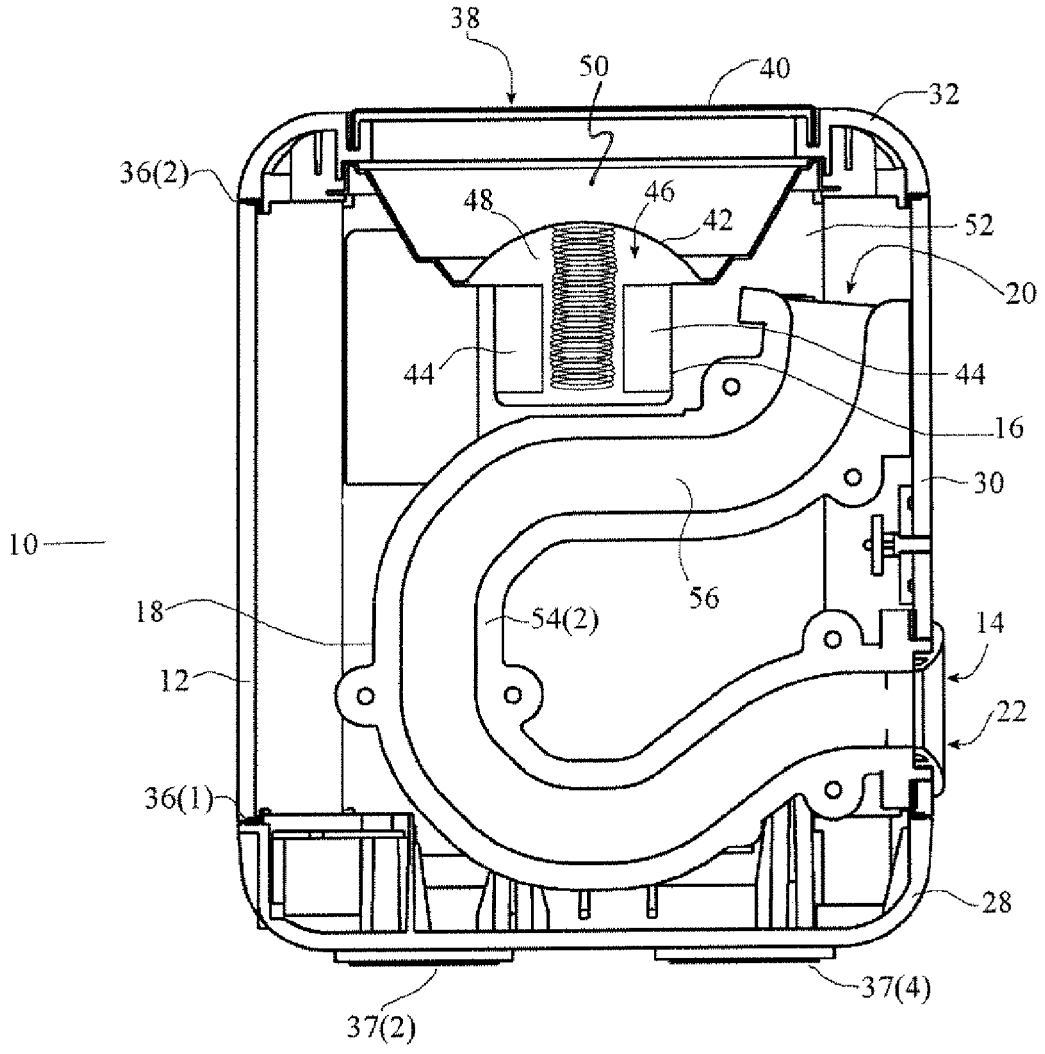
FIG. 4 is a cross-sectional view of the audio system shown in FIG. 2 taken along lines 4-4.

Referring more specifically to FIGS. 1, 3, and 4, the housing 12 includes a base 28, a side enclosure 30, and a cover 32, although the housing 12 could comprise other numbers and types of components in other configurations. The base 28 and cover 32 are made of plastic and the side enclosure 30 is made of aluminum, although the base 28, side enclosure 30, and cover 32 can each be made of other types of materials, such as but not limited to wood, plastic, and/or other types of metals. The side enclosure 30 is made of a thermally conductive material and is thermally coupled to the tube 18 and can help dissipate heat generated by components in the audio system 10, such as power amplifier 24 or transistor 26, although again the side enclosure 30 can be made of other types of materials. The side enclosure 30 also has four sides and the port 14 along one of those sides, although the side enclosure 30 can have other numbers and types of sides and openings in other configurations.

The base 28 is secured to one end of the side enclosure 30 and the cover 32 is secured to the other end of the side enclosure 30 by a plurality of securing rods 34(1)-34(4) which extend through and are secured to the base 28, the side enclosure 30, and the cover 32, although the base 28, side enclosure 30, and cover 32 can be secured together in other manners and configurations. End caps 35(1)-35(4) are fitted on one end of each of the securing rods and pads 37(1)-37(4) are secured to the bottom surface of base 28 to provide protection on the surface the audio system 10 is resting on. A seal 36(1) is located between the base 28 and one end of the side enclosure 30 and another seal 36(2) is located between the cover 32 and side enclosure 30. Furthermore, the cover 32 includes an opening 38 located over and spaced from the speaker driver 16. A speaker grill 40 with a plurality of passages to permit the sound to be transmitted out from the speaker driver 16 is secured to the cover 32 over the opening 38

The speaker driver 16 includes a diaphragm 42, a magnet 44 with an opening 46, and an electromagnet 48 which is connected to the diaphragm 42, although the speaker driver 16 can have other types and numbers of elements in other configurations and other types of speaker drivers can be used. The speaker driver 16 divides the housing 12 into a chamber 50 between the diaphragm 42 and the speaker grill 40 and another interior chamber 52 behind the diaphragm 42, although the housing 12 could have other numbers of chambers in other configurations. Preferably in order to further preserve the audio sound quality and clarity, the level of tension to which the securing rods 34(1)-34(4) are tightened is such that the seals 36(1)-36(2), the side enclosure 30, the cover 32, and the base 28 form the substantially air-tight interior chamber 52 inside the housing 12 of the audio system 10; whereby, air can enter and exit the interior chamber 52 essentially only through the port 14. Since the structure and operation of speaker drivers is well known to those of ordinary skill in the art, they will not be described in great detail here.

In this particular embodiment, the electromagnet 48 comprises a conductive coil wrapped around a cylindrical conductive core with a pair of leads (not shown) for receiving an alternating incoming signal, although the electromagnet 48 can have other types and numbers of elements in other configurations and other types of magnets could be used. The electromagnet 48 is positioned in the opening 46 in the magnet 44 and the magnet 44 extends around the electromagnet 48, although the magnet 44 could have other configurations, such as extending around a portion or portions of the electromagnet 48. In this particular embodiment, the speaker driver 16 comprises a subwoofer that provides outstanding heat dissipation because of the large displacement/amplitude of the electromagnet 48 in the speaker driver 16 during use, although the present invention can be used with other types of speaker drivers.

In this particular embodiment, the tube 18 comprises a pair of halves 54(1) and 54(2) which are bolted together and which define a through passage 56 with the pair of openings 20 and 22 at each end, although the tube 18 can comprise a one piece tube or have other numbers of sections which are joined in other manners with other numbers of openings. The length and configuration of the tube 18 is selected in manners well known to those of ordinary skill in the art in order to optimize sound quality, although other lengths and configurations can be used. In this particular embodiment, the sound exiting through the tube 18 should substantially match and/or complement the sound being emitted through the speaker grill 40, although other configurations for the amounts of sound emitted from the different locations of the audio system 10 can be used. The tube 18 is made of aluminum, although the tube 18 could be made of one or more other thermally conductive materials or could be made of other materials, such as a combination of thermally conductive and nonconductive materials. Additionally, the tube 18 has a substantially smooth, contoured surface, although the tube 18 could have a textured or dimpled surface and/or protrusions thermally coupled to the tube 18 in order to increase the surface area and thus heat dissipation capabilities of the tube 18. In these embodiments, the heat dissipation properties of the tube 18 improve as the thickness of the wall or walls of the tube 18 is reduced and/or as the surface area of the tube 18 is increased.

One opening 20 of the tube 18 is positioned adjacent to the speaker driver 16 and behind the diaphragm 42 in interior chamber 52 to direct air coming from the tube 18 onto the speaker driver 16 and the other opening 22 is secured to the port 14 in the housing 12 to permit air to flow out of and into the housing 12, although the openings 20 and 22 could be in other locations. By way of example only, the opening 22 may be adjacent, but spaced from the port 14 in the housing 12 and the opening 22 can be thermally coupled to the magnetic structure of the speaker driver 16. The tube 18 also is thermally coupled to the side enclosure 30 to further help with heat dissipation and expulsion, although other configurations can be used, such as not having the tube 18 coupled to the side enclosure 30.

The tube 18 has thermal couple protruding sections 58 and 60 extending from and integrally formed with the half 54(1) of the tube, although the tube 18 could have other numbers and types of protruding sections which are connected to the tube 18 in other manners. In this particular embodiment, the audio system 10 is shown with the power amplifier 24 and the transistor 26, although the audio system 10 can have other types and numbers of heat generating components in other configurations which are thermally coupled to the tube 18 and side enclosure 30. The power amplifier 24 is bolted to the thermal couple protruding section 60 and the heat sink 62 on the transistor 26 is bolted to the thermal couple protruding section 58 to help dissipate heat generated by the power amplifier 24 and the transistor 26 to the tube 18, although the power amplifier 24, transistor 26, and other heat generating components or elements can be coupled to the tube 18 in other manners and at other locations.

In this particular embodiment and in order to further help prevent component damage and overheating of the audio system 10, a thermal monitoring circuit 61 is coupled to the tube 18, the power amplifier 24, the transistor 26, and the side enclosure 30, although the thermal monitoring circuit 61 can be coupled to other heat generating components and elements, such as the power supply. The thermal monitoring circuit 61 monitors the temperature of the tube 18, the power amplifier 24, the transistor 26, and the side enclosure 30 and shuts off power to audio system 10 when the interior of the housing 12 or one of the monitored components or elements, such as the tube 18, the power amplifier 24, the transistor 26, or the side enclosure 30, reaches a certain set temperature. Since the components and operation of thermal monitoring circuits is well known to those of ordinary skill in the art they will not be described in detail here. Although this particular embodiment includes the thermal monitoring circuit 61, the use traditional preventive means, such as the thermal monitoring circuit 61 and/or external heat sinks, in conjunction with air being pulled into or drawn out of the openings 20 and 22 to the passage 56 in tube 18 is not required for the present invention.

The operation of the audio system 10 will now be described with reference to FIGS. 1, 3, and 4. Since the operation of a speaker driver 16 is well known to those of ordinary skill in the art and thus will not be described in great detail here. An alternating incoming signal, which is representative of an audio signal to be broadcast, is transmitted to the input leads to the conductive coil of the electromagnet 48. In response to the alternating signal, the polarity of the conductive coil for the electromagnet 48 changes causing the electromagnet 48 to oscillate in the opening 46 in the magnet 44. Since the electromagnet 48 is secured at one end to the diaphragm 42, the diaphragm 42 also oscillates with the movement of the electromagnet 48. The movement of the diaphragm 42 causes air to be pulled into or drawn out of the openings 20 and 22 to the passage 56 in tube 18.

During operation, components of the audio system 10, such as the power amplifier 24 and the transistor 26, generate heat that is contained within the bodies of those components and also within the interior chamber 52 of the housing 12. The power amplifier 24, the transistor 26, and other heat generating components or elements are thermally coupled to the tube 18, which is made of thermally conductive materials. This enables heat generated by the power amplifier 24, the transistor 26, and other heat generating components or elements to be transferred at least partially to and permeate through at least a portion of the tube 18 to help dissipate the generated heat.

Additionally, as described earlier, the operation of the diaphragm 42 causes air to be pulled into or drawn out of the openings 20 and 22 to the passage 56 in tube 18. This air flow in the passage 56 of the tube 18 helps to further cool the heated tube 18 and dissipate the heat which has been transferred from the speaker driver 16, the power amplifier 24, the transistor 46, and/or any other heat generating components, such as a power source, in the audio system 10 which are thermally coupled to the tube 18. The heated air in the tube 18 is simply exhausted out of the opening 22 of the tube 18 connected to the port of the housing 12 and fresh cooler air can be drawn in for further cooling.

Further, within the housing 12 heat generated by the speaker driver 16, power amplifier 24, the transistor 46, and/or any other heat generating components in the audio system 10 rises to the top of interior chamber 52 in the housing 12 near the speaker driver 16, although the components of the audio system 10 could have other orientations. When the diaphragm 42 moves, the hot air at the top of interior chamber 52 is forced into the opening 20 of the tube 18 and out through the opening 22 and then out of port 14 to provide further heat dissipation, although the components of the audio system 10 can be arranged in other manners. Additionally, when the diaphragm 42 moves to draw air in through port 14 into opening 22 and out opening 20, the opening 20 is positioned to direct the cooler air at the speaker driver 16 and also to provide cooler air in interior chamber 52 which drops down to the other heat generating components and elements to provide additional cooling, although the air could be directed at other locations, such as towards other heat generating components and elements.

Accordingly, the present invention is able to effectively dispose of excess heat generated by internal electronic components within a system. Additionally, the present invention is able to accomplish this heat dissipation in substantially less space than previously was possible without sacrificing, compromising, and/or deteriorating the sound quality and clarity. The present invention does not require large heat sinks, expensive fan systems, and/or "chimney effect" ventilation systems to keep components cool and operating properly. Further, the present invention extends the life of the system by more effectively dissipating the heat generated by internal components. Although the present invention is shown in the exemplary embodiment with an audio system 10 with subwoofer, the present invention can be used with other types of ported systems, especially amplified systems and loudspeakers, to assist with heat dissipation.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. An audio system comprising:

a housing which has at least one port;

at least one speaker driver with a diaphragm located in the housing;

a tube with at least two openings, the tube is at least partially located in the housing with one of the openings of the tube at least adjacent to the port of the housing, wherein movement of the diaphragm moves air into and out of the tube; and at least one electronic component is thermally coupled to the tube, wherein the tube is made at least partially of one or more thermally conductive materials.

2. The system as set forth in claim 1 wherein the one of the openings of the tube is connected to the housing adjacent to the port.

3. The system as set forth in claim 2 wherein the one of the openings of the tube is thermally coupled to the housing adjacent to the port.

4. The system as set forth in claim 1 wherein at least a portion of the housing is made of one or more thermally conductive materials.

5. The system as set forth in claim 4 wherein the tube and the portion of the housing are each made of one or more metallic materials.

6. The system as set forth in claim 1 wherein the other one of the openings of the tube is positioned to direct the air from the tube on at least a portion of the at least one speaker driver.

7. The system as set forth in claim 6 wherein the other one of the openings of the tube is thermally coupled to the at least one speaker driver.

8. The system as set forth in claim 1 wherein the tube further comprises at least one protruding section which extends out from the tube and is thermally coupled to the at least one electronic component.

9. The system as set forth in claim 1 wherein the at least one electronic component comprises an amplifier.

10. The system as set forth in claim 1 wherein the speaker driver further comprises:

a first magnet with an opening; and an electromagnet comprising a conductive coil disposed in the opening of the first magnet, wherein the diaphragm which is connected to the conductive coil oscillates in response to an incoming signal which changes a polarity of the conductive coil.

11. The system as set forth in claim 1 further comprises at least one heat management device.

12. A method of making an audio system, the method comprising:

providing a housing which has at least one port;

locating at least one speaker driver with a diaphragm in the housing;

positioning a tube at least partially in the housing, the tube having at least two openings with one of the openings of the tube at least adjacent to the port of the housing;

thermally coupling at least one electronic component to the tube, wherein the tube is made at least partially of one or more thermally conductive materials; and positioning the other one of the openings of the tube on at least a portion of the at least one speaker driver to direct the air from the tube.

13. The method as set forth in claim 12 further comprising connecting the one of the openings of the tube to the housing adjacent to the port.

14. The method as set forth in claim 13 further comprising thermally coupling the one of the openings of the tube to the housing adjacent to the port.

15. The method as set forth in claim 12 wherein at least a portion of the housing is made of one or more thermally conductive materials.

16. The method as set forth in claim 15 wherein the tube and the portion of the housing are each made of one or more metallic materials.

17. The method as set forth in claim 12 further comprising thermally coupling the other one of the openings of the tube to the at least one speaker driver.

18. The method as set forth in claim 12 wherein the at least one electronic component comprises an amplifier.

19. The method as set forth in claim 12 wherein the speaker driver further comprises:

a first magnet with an opening; and an electromagnet comprising a conductive coil disposed in the opening of the first magnet, wherein the diaphragm which is connected to the conductive coil oscillates in response to an incoming signal which changes a polarity of the conductive coil.

20. A method of dissipating heat in an audio system, the method comprising:

thermally coupling one or more electronic components to a tube, wherein the tube is made at least partially of one or more thermally conductive materials, is located at least partially in a housing, and has at least two openings with one of the openings at least adjacent to a port from the housing; and moving a diaphragm of a speaker driver in the housing, wherein the other opening of the tube is in the housing and movement of the diaphragm moves air into and out of the tube through the openings.

21. The method as set forth in claim 20 further comprising connecting the one of the openings of the tube to the housing adjacent to the port.

22. The method as set forth in claim 21 wherein at least a portion of the housing is made of one or more thermally conductive materials.

23. The method as set forth in claim 22 wherein the tube and the portion of the housing are each made of one or more metallic materials.

24. The method as set forth in claim 20 further comprising positioning the other one of the openings of the tube to direct the air from the tube on at least a portion of the at least one speaker driver.

25. The method as set forth in claim 24 further comprising thermally coupling the other one of the openings of the tube to the at least one speaker driver.

26. The method as set forth in claim 20 wherein the tube further comprises at least one protruding section which extends out from the tube and wherein the thermally coupling further comprises thermally coupling the at least one protruding section to the one or more electronic components.

27. The method as set forth in claim 20 wherein the at least one electronic component comprises an amplifier.

28. The method as set forth in claim 20 wherein the speaker driver further comprises:

a first magnet with an opening; and an electromagnet comprising a conductive coil disposed in the opening of the first magnet, wherein the diaphragm which is connected to the conductive coil oscillates in response to an incoming signal which changes a polarity of the conductive coil.

29. The method as set forth in claim 20 further comprising providing at least one heat management device.

* * * * *